United States Patent [19]
Fazi et al.

[11] Patent Number: 6,111,452
[45] Date of Patent: Aug. 29, 2000

[54] WIDE DYNAMIC RANGE RF MIXERS USING WIDE BANDGAP SEMICONDUCTORS

[75] Inventors: Christian Fazi, Columbia, Md.; Philip G. Neudeck, Olmsted Falls, Ohio

[73] Assignee: The United States of America as represented by the Secretary of the Army, Washington, D.C.

[21] Appl. No.: 08/803,887

[22] Filed: Feb. 21, 1997

[51] Int. Cl.[7] .................................. H04B 1/26
[52] U.S. Cl. .................. 327/355; 327/113; 327/116; 327/356; 455/326; 455/330
[58] Field of Search ................... 327/113, 114, 327/116, 119, 355, 356; 455/326, 330, 333, 331; 333/218; 257/10, 77

[56] References Cited

U.S. PATENT DOCUMENTS

| | | | |
|---|---|---|---|
| 4,513,250 | 4/1985 | Harman | 333/218 |
| 4,896,374 | 1/1990 | Waugh et al. | 455/326 |
| 5,406,237 | 4/1995 | Ravas et al. | 333/218 |
| 5,559,358 | 9/1996 | Burns et al. | 257/431 |
| 5,670,788 | 9/1997 | Geis | 257/10 |

OTHER PUBLICATIONS

Bhatnagar and Baliga, Comparison of 6H–SiC, 3C–SiC, and Si for Power Devices, Mar. 3, 1993.

*Primary Examiner*—Dinh Le
*Attorney, Agent, or Firm*—Paul S. Clohan, Jr.; Mark D. Kelly

[57] ABSTRACT

A wide dynamic range RF mixer is shown using wide bandgap semiconductors such as SiC, GaN, AlGaN, or Diamond instead of conventional narrow bandgap semiconductors. The use of wide bandgap semiconductors will permit RF mixers to operate in higher RF environments, to be less susceptible to out-of-band jamming and interference, and to be more effective in receiving weak RF signals in the presence of strong unwanted signals. RF receivers can be more closely collocated to transmitters and still receive weak signals without suffering intermodulation distortion products

33 Claims, 4 Drawing Sheets

WIDE DYNAMIC RANGE RF MIXERS USING WIDE BANDGAP SEMICONDUCTORS

BACKGROUND OF THE INVENTION

Mixers are used in various communication and navigational systems to produce a radio wave of lower frequency by mixing the incoming wave with a wave generated by a local oscillator (LO). This is typically performed using the nonlinear current-voltage characteristics of diodes to act as a solid-state switch. The output of the mixer is referred to as an intermediate frequency (IF). One or more stages of amplification are typically used downstream of the mixer to increase the voltage of the IF signal. Because of this, it is important that the mixer not add an undesirable signal to the incoming wave since it would be amplified indiscriminately with the desired signal. Low noise, strong nonlinearity, repeatable electrical properties from device to device, and adequate dynamic range are important characteristics in mixer design and selection.

The useful dynamic range of a mixer is bounded by the noise level of the mixer and the level at which the mixer can no longer linearly process the incoming RF waveform, that is, when a one dB increase at the RF input port, no longer yields a one dB change at the IF output port. The dynamic range of mixers typically exceed the dynamic range of small signal amplifiers and crystal detectors. Amplifiers are thus used ahead of a mixer only where low signal level detection is critical, otherwise strong signals will degrade the RF amplifiers response and feed undesired signals to the mixer.

While mixing occurs in these devices because of the current-voltage (I–V) nonlinearity characteristic of the device, this nonlinearity also produces intermodulation distortion (IMD) products. When two closely spaced tones are mixed, for example, intermodulation products appear above and below the original pair of tones at a distance equal to the difference between the two original frequencies.

Current methods to increase the saturated output level of mixers and thereby reduce IMD products have focused on increasing the LO power level of the device by increasing the number of diodes used in the mixer circuit. This is done, for example, via multiple-diode balanced circuits, combining mixers with a 180-degree or quadrature hybrid, or another technique that splits the LO and RF input power between multiple diodes. Fabrication and matching of multiple diodes, however, is difficult and timely, thus increasing the cost of such multiple-diode mixers.

Most power semiconductor devices being utilized today are fabricated in monocrystalline silicon. However, as is known to those skilled in the art, monocrystalline silicon carbide is particularly well suited for use in semiconductor devices, and in particular for power semiconductor devices. Silicon carbide has a wide bandgap (above 3 eV), a high melting point, a low dielectric constant, a high breakdown field strength, a high thermal conductivity and a high saturation electron drift velocity compared to silicon. These characteristics would allow silicon carbide power devices to operate at higher temperatures, higher power levels, with lower specific on-resistance that conventional silicon based power devices. By way of background, a theoretical analysis of the superiority of silicon carbide devices over silicon devices is found in a publication by Bhatnagar and Baliga entitled "Comparison of 6H-SiC, and Si for Power Devices", IEEE Transactions on Electron Devices, Vol. 40, pp. 645–655, 1993. In addition to SiC, another wide bandgap material, GaN, is just becoming available. Currently GaN is being used to make blue light emitting diodes, and should prove equally effective for the same reasons as SiC.

SiC exists in a large number of polytypes which have different stacking sequences of double layers of Si and C atoms. Presently, 6H, 4H and 3C-SiC are candidate materials for SiC device fabrication. Advantages of 6H, & 4H-SiC, also known as α-SiC, are its large bandgap (approximately 3 eV) which results in high breakdown field strength. Compared to 6H, 4H-SiC, 3C-SiC, or β-SiC, has a smaller Bandgap (2.2 eV) and lower maximum field strength, but has high electron mobility, like 4H. Additionally, it may be possible to grow good-quality 3C-SiC epilayers on Si which would make it a cheaper alternative to costly 6H-SiC commercial epilayers and also makes it compatible with present Si technology.

BRIEF SUMMARY OF THE INVENTION

Accordingly, an object of the present invention is to provide wide a dynamic range RF mixer by using wide bandgap semiconductors instead of conventional narrow bandgap semiconductors Another object of the present invention is to provide a mixer with low intermodulation distortion, wide dynamic range, and high-temperature operational capability.

A related object of the present invention is to allow for the extraction of weak RF signals even in the presence of strong undesired signals.

Another object of the present invention is to provide a mixer that will allow for closer location of RF sources and receivers without severe interference.

A further object of the present invention is to provide a mixer that will allow for improved communications and navigational equipment for aircraft, maritime, and other applications.

Still other objects and advantages of the present invention will become readily apparent to those skilled in this art from the detailed description, wherein only the preferred embodiment of the present invention is shown and described, simply by way of illustration of the best mode contemplated of carrying out the present invention. As will be realized, the present invention is capable of other and different embodiments, and its several details are capable of modifications in various obvious respects, all without departing from the present invention. Accordingly, the drawings and descriptions are to be regarded as illustrative in nature, and not as restrictive.

These and other objects are achieved by a wide dynamic range RF mixer using wide bandgap semiconductors instead of conventional narrow bandgap semiconductors. The use of wide bandgap semiconductors will permit RF mixers to operate in higher RF environments, to be less susceptible to out-of-band jamming and interference, and to be more effective in receiving weak RF signals in the presence of strong unwanted signals. RF receivers can be more closely collocated to transmitters and still receive weak signals without suffering intermodulation distortion products.

DETAILED DESCRIPTION OF THE INVENTION

Figure 1:
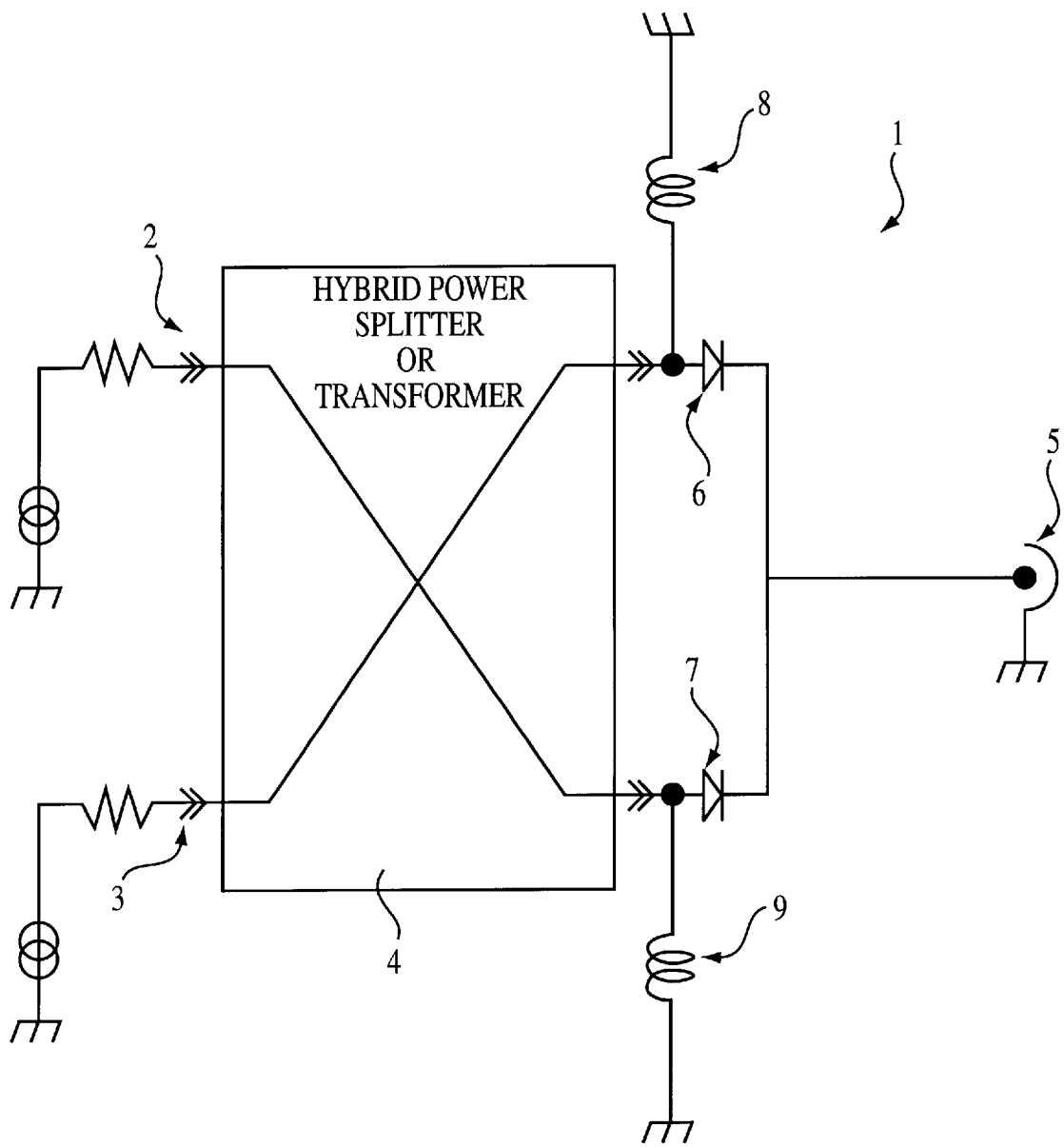
FIG. 1 is an electrical schematic of one embodiment of the present invention, also known as a balanced mixer.

Referring to FIG. 1, one embodiment, a balanced mixer, of the present invention is illustrated by way of a circuit schematic. When two ports are isolated (usually the RF and LO) and two diodes are used with one or more transformers or hybrid circuits, the mixer is referred to as a "single balanced" mixer (also known as a "balanced" mixer). This is the most common of mixers because of optimum tradeoff between performance and some limited isolation. Other embodiments, a single-ended mixer, and a double-balanced mixer, will be discussed later. Mixer 1 includes RF port 2, LO port 3, hybrid splitter 4, IF port 5, silicon carbide diodes 6 & 7 and coils 8 & 9 that provide a DC return path. Diodes 6 & 7 can also be made from GaN, Diamond, or AlGaN (where the mixture of Al and Ga varies anywhere from 0% Al: 100% Ga to 100% Al: 0% Ga). Diodes 6 & 7 can be homojunction diodes (the diode junction contains one semiconductor material), heterojunction diodes (the diode junction contains at least two different semiconductor materials), pn junction diodes (the junction of p-type semiconductor and n-type semiconductor forms the diode junction) or Schottky diodes (the junction of metal contact to semiconductor forms the diode junction). Transistors could also be substituted for diodes 6 & 7. Hybrid splitter 4 is a standard 90-degree hybrid power splitter, part number MA MPS388 from Microwave Associates. It is used here to split the signals from RF port 2 and LO port 3, and to feed both signals to diodes 6 & 7. The input of diodes 6 & 7 are tied to the output of hybrid splitter 4, and the output of diodes 6 & 7 are tied together and fed into IF port 5. In this way, RF energy is connected to one input of hybrid splitter 4 and is divided into two equal signals. Similarly, the LO signal is connected to the other input of hybrid 4 and is also divided into two equal signals which are fed to diodes 6 & 7. With the exception of the material used for diodes 6 & 7, the circuitry of FIG. 1 is a standard balanced mixer design which is well known in the art. As fully discussed below, the use of wide bandgap material, such as SiC, GaN, AlGaN, or Diamond produces unexpected results in reduced IMD products.

Figure 2:
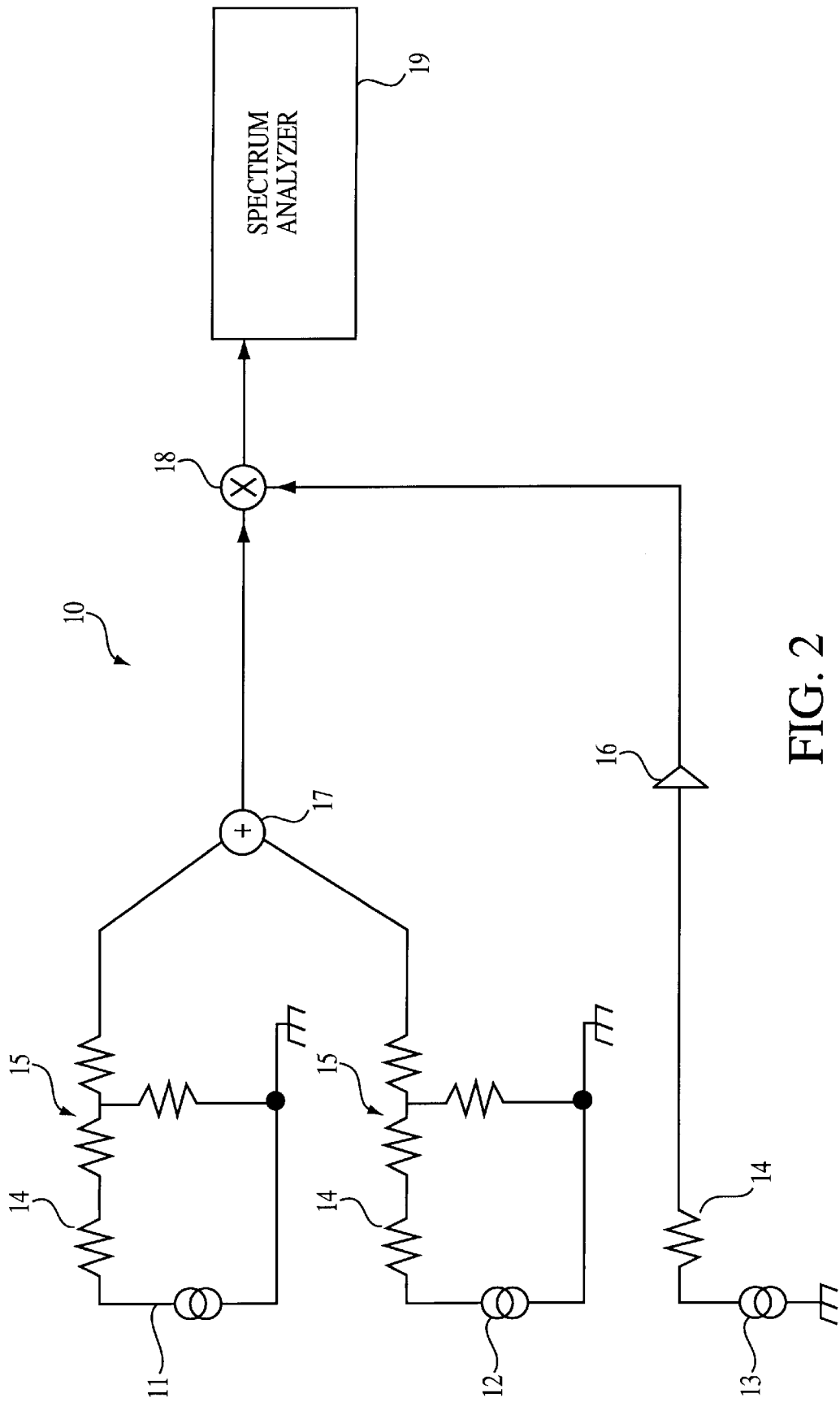
FIG. 2 is an electrical schematic of the test apparatus used to compare the intermodulation distortion products of the present device with the intermodulation distortion products produced with a standard mixer.

FIG. 2 is an electrical schematic of the test apparatus 10 used to compare the intermodulation distortion of the SiC balanced mixer version of the present invention with the intermodulation distortion produced by a standard silicon-diode balanced mixer. The apparatus includes RF signal 1 input port 11, RF signal 2 input port 12, LO signal input port 13, 50 ohm resistors 14, and 10 dB attenuators 15, combiner 17 providing a two-tone input to mixer 18, a 20 dB amplifier for the SiC test (omitted for the Si tests) and a 50 ohm output to spectrum analyzer 19 for analyzing the resulting IF spectrum.

Figure 3:
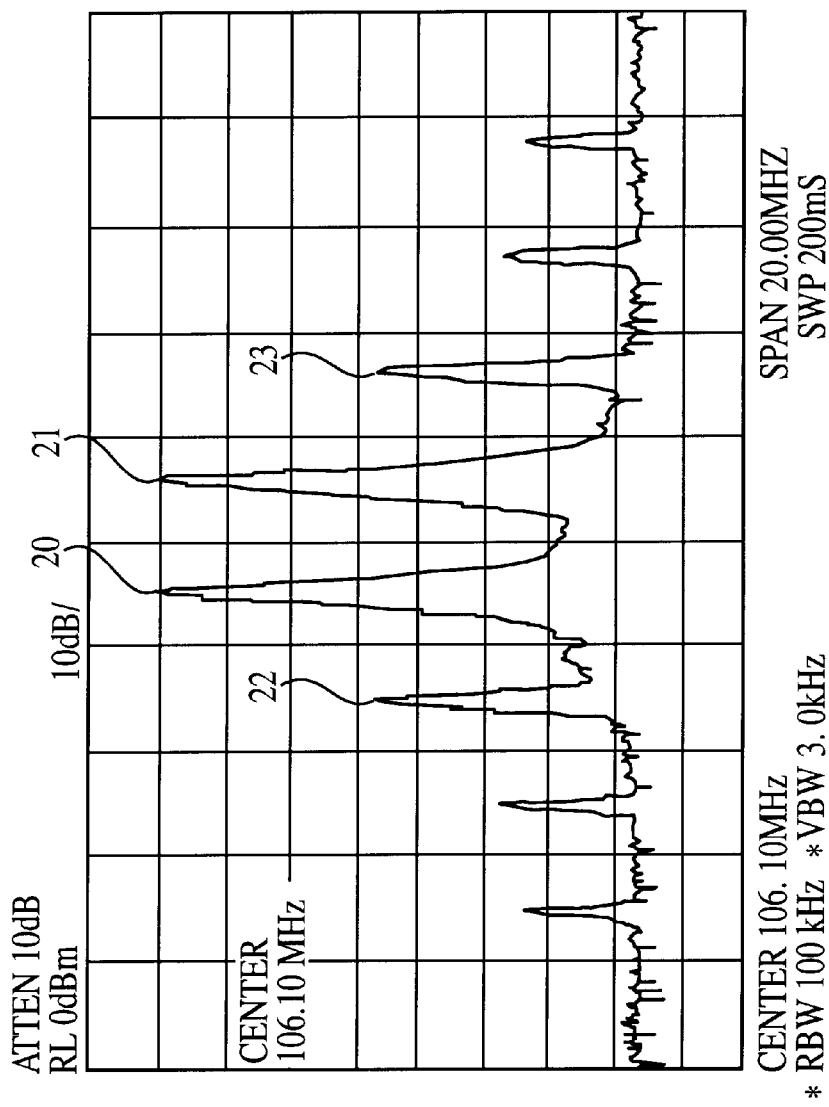
FIG. 3 is a graph of the IF signal spectrum using standard silicon diodes tested on the apparatus shown in FIG. 2.

FIG. 3 is a graph of the IF signal spectrum using the balanced mixer tester of FIG. 2 with standard Silicon diodes in mixer 18. The graph is centered at 106.10 MHz with a span of 20.00 MHZ. Original tones 20 and 21 appear as peaks located at equal distance on either side of the 106.10 MHz center. An intermodulation distortion product is apparent in FIG. 3 as tones 22 and 23, which appear at equal distance on either side of original tones 20 and 21. In particular, the separation between tones 20 and 22, and between 21 and 23, is the same as the separation between tones 20 and 21. This is expected as the result of the nonlinear behavior of diode mixers as noted above.

The strength of the intermodulation distortion 22 and 23 is significant in comparison with the strength of the original tones 20 and 21. In most mixer applications this undesired signal is amplified downstream of the mixer indiscriminately with the desired signal. Problems in extracting the desired signal, interference between closely located RF sources and receivers, and generally poor performance can result.

Figure 4:
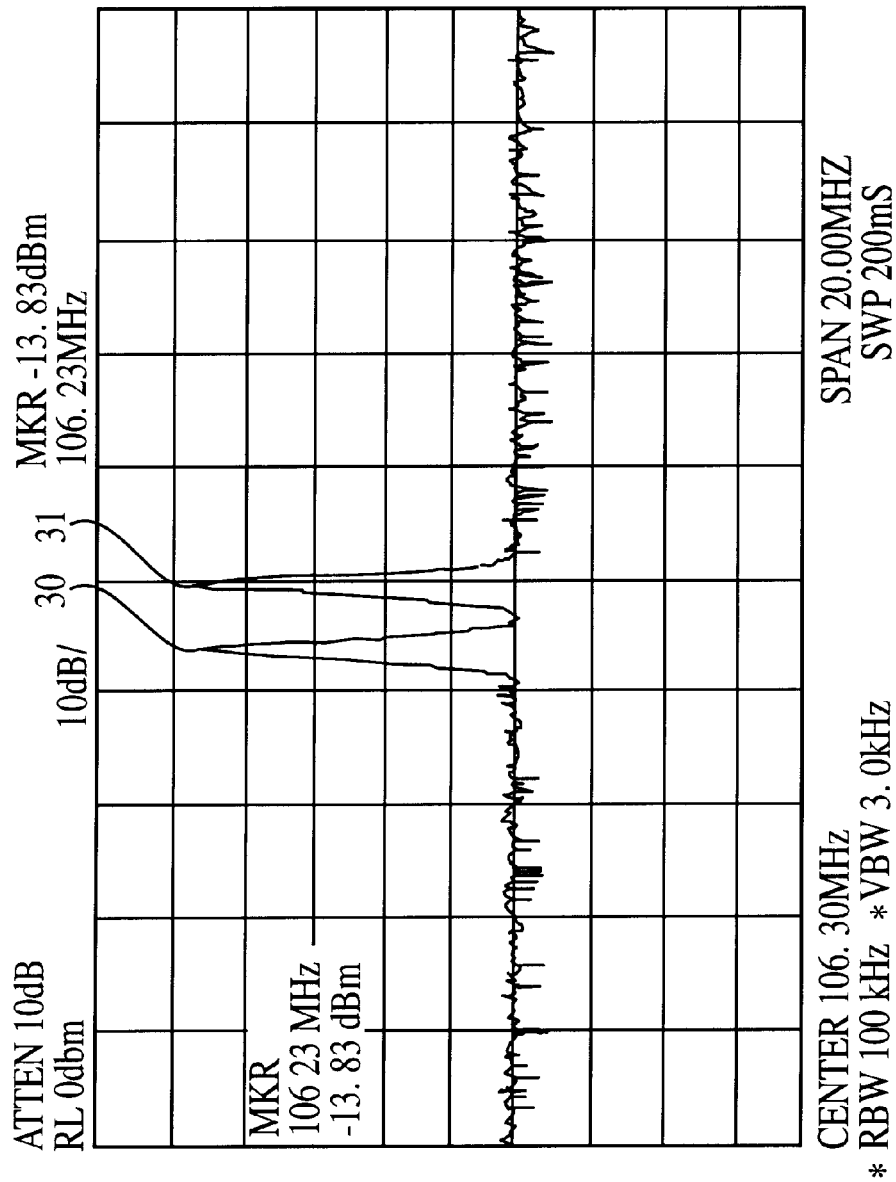
FIG. 4 is a graph of the IF signal spectrum using SiC diodes tested on the apparatus of FIG. 2 in accordance with the present invention.

FIG. 4 is a graph of the IF signal spectrum using the same FIG. 2 test apparatus and mixer 18 that produced the data of FIG. 3, but using SiC diodes for mixer 18 in accordance with the present invention. As in FIG. 3, the original tones 30 and 31 appear as peaks located at equal distance on either side of center. In order to produce the same conversion loss of approximately 10 dB, the LO power is approximately 20 dB higher than the LO power used to produce the results illustrated in FIG. 3. This is due to the higher turn-on voltage of SiC diodes as compared to Silicon diodes. As illustrated in FIG. 4, the intermodulation distortion product that appears as tones 22 and 23 in FIG. 3 does not appear in FIG. 4. In fact, it was not possible to measure any IMD products with the present test apparatus.

This decrease in IMD products is the result of the higher turn-on voltage of silicon carbide diodes which shift the characteristics of the diode switches. This provides an alternative to the current practice used to reduce intermodulation distortion wherein several diodes are placed in series to increase the diode turn-on voltage. In accordance with the present invention, it is now possible to use wide bandgap diodes, such as silicon carbide or GaN, to obtain similar or better performance since only two diodes are needed, instead of the twelve conventional diodes it takes to achieve the same diode turn-on and resulting IMD levels. Fabrication and matching of twelve standard Silicon diodes is much more costly than fabricating two SiC diodes.

When all three ports are not isolated from each other and only one mixer diode is used, the mixer is called a "single-ended" mixer, and it is the simplest of the mixer circuits and it is often used at very high frequencies when low cost and low conversion loss is required. This type of mixer can also utilize wide bandgap diodes. The "double-balanced" mixer has all ports isolated from each other. It has the highest LO power requirements and the highest conversion loss, since it uses at least four diodes, and at least two transformers or hybrid circuits. It is used when maximum port isolation is required. This type of mixer can also utilize wide bandgap diodes.

With the present invention, it is also possible to use p-n junction diodes as an alternative to Schottky diodes because the minority lifetime is much shorter in silicon carbide than in silicon. It is also possible to use heterojunction diodes consisting of more than one semiconductor, where at least one of the semiconductors is wide-bandgap in nature. In addition, IMD products will also be suppressed in RF mixers when using silicon carbide transistors as switches. The above results also support improved IMD performance in small signal RF amplifiers using silicon carbide transistors and solid state T/R switches used in transmit and receive functions. In general, improved IMD performance will result in wider dynamic range receivers, capable of extracting weak signals in the presence of strong undesired ones. Closer location of RF sources and receivers is possible. More RF repeaters on the same tower or mast, for example, or cellular radio use in the presence of other VHF or UHF repeaters is possible. Better performance short wave radios and improved communications and navigation systems aboard aircraft and ships will also result from the present invention.

It will be readily seen by one of ordinary skill in the art that the present invention fulfills all of the objects set forth above. After reading the foregoing specification, one of ordinary skill will be able to effect various changes, substitutions of equivalents and various other aspects of the present invention as broadly disclosed herein. It is therefore intended that the protection granted hereon be limited only by the definition contained in the appended claims and equivalents thereof Having thus shown and described what is at present considered to be the preferred embodiment of the present invention, it should be noted that the same has been made by way of illustration and not limitation. Accordingly, all modifications, alterations and changes coming within the spirit and scope of the present invention are herein meant to be included.

I claim:

1. A balanced mixer comprising:
   an RF port;
   a LO port;
   a pair of wide bandgap solid state semiconductor diodes;
   means for coupling said RF and LO ports to said pair of diodes; and an IF output port coupled to said diodes;
   wherein said wide bandgap diodes significantly reduce intermodulation distortion to increase a dynamic range of said balanced mixer.

2. The mixer of claim 1 wherein said wide bandgap semiconductor diodes are made from SiC.

3. The mixer of claim 1 wherein said wide bandgap semiconductor diodes are made from GaN.

4. The mixer of claim 1 wherein said wide bandgap semiconductor diodes are made from diamond.

5. The mixer of claim 1 wherein said wide bandgap semiconductor diodes are made from AlGaN.

6. The mixer of claim 1 wherein said diodes are homojunction diodes.

7. The mixer of claim 1 wherein said diodes are heterojunction diodes.

8. The mixer of claim 1 wherein said diodes are pn junction diodes.

9. The mixer of claim 1 wherein said diodes are Schottky diodes.

10. The mixer of claim 1 wherein said means for coupling comprises a hybrid coupler.

11. The mixer of claim 1 wherein said means for coupling comprises a transformer.

12. A single-ended mixer comprising:
    an RF port;
    a LO port;
    a wide bandgap solid state semiconductor diode;
    means for coupling said RF and LO ports to said diode; and
    an IF output port coupled to said diode;
    wherein said wide bandgap diode significantly reduces intermodulation distortion to increase a dynamic range of said single-ended mixer.

13. The mixer of claim 12 wherein said wide bandgap semiconductor diode is made from SiC.

14. The mixer of claim 12 wherein said wide bandgap semiconductor diode is made from GaN.

15. The mixer of claim 12 wherein said wide bandgap semiconductor diode is made from diamond.

16. The mixer of claim 12 wherein said wide bandgap semiconductor diode is made from AlGaN.

17. The mixer of claim 12 wherein said diode is a homojunction diode.

18. The mixer of claim 12 wherein said diode is a heterojunction diode.

19. The mixer of claim 12 wherein said diode is a pn junction diode.

20. The mixer of claim 12 wherein said diode is a Schottky diode.

21. The mixer of claim 12 wherein said means for coupling comprises a hybrid coupler.

22. The mixer of claim 12 wherein said means for coupling comprises a transformer.

23. A double balanced mixer comprising:
    an RF port;
    a LO port;
    a plurality of wide bandgap solid state semiconductor diodes;
    means for coupling said RF and LO ports to said diodes; and
    an IF output port coupled to said diodes;
    wherein said wide bandgap diodes significantly reduce intermodulation distortion to increase a dynamic range of said double balanced mixer.

24. The mixer of claim 23 wherein said wide bandgap semiconductor diodes are made from SIC.

25. The mixer of claim 23 wherein said wide bandgap semiconductor diodes are made from GaN.

26. The mixer of claim 23 wherein said wide bandgap semiconductor diodes are made from diamond.

27. The mixer of claim 23 wherein said wide bandgap semiconductor diodes are made from AlGaN.

28. The mixer of claim 23 wherein said diodes are homojunction diodes.

29. The mixer of claim 23 wherein said diodes are heterojunction diodes.

30. The mixer of claim 23 wherein said diodes are pn junction diodes.

31. The mixer of claim 23 wherein said diodes are Schottky diodes.

32. The mixer of claim 23 wherein said means for coupling comprises a hybrid coupler.

33. The mixer of claim 23 wherein said means for coupling comprises a transformer.

* * * * *